United States Patent [19]

Sasaki et al.

[11] Patent Number: 5,427,962
[45] Date of Patent: Jun. 27, 1995

[54] METHOD OF MAKING A THIN FILM TRANSISTOR

[75] Inventors: Makoto Sasaki, Tokyo; Hiromitsu Ishii, Tokorozawa; Kazuhiro Sasaki, Fussa, all of Japan

[73] Assignee: Casio Computer Co., Ltd., Tokyo, Japan

[21] Appl. No.: 974,183

[22] Filed: Nov. 10, 1992

[30] Foreign Application Priority Data

| Nov. 15, 1991 | [JP] | Japan | 3-326776 |
| Jun. 18, 1992 | [JP] | Japan | 4-182806 |
| Jun. 18, 1992 | [JP] | Japan | 4-182807 |
| Jun. 18, 1992 | [JP] | Japan | 4-182808 |

[51] Int. Cl.⁶ ............................. H01L 21/265
[52] U.S. Cl. ............................. 437/41; 437/187; 437/909; 437/170
[58] Field of Search ........... 437/40, 41, 101, 909, 437/DIG. 53, 21, 187, 170

[56] References Cited

U.S. PATENT DOCUMENTS

| 4,459,739 | 7/1984 | Shepherd et al. | 29/571 |
| 5,053,354 | 10/1991 | Tanaka et al. | 437/101 |
| 5,091,337 | 2/1992 | Wantanbe et al. | 437/181 |

FOREIGN PATENT DOCUMENTS

| 62-213278 | 9/1987 | Japan |
| 1-025482 | 1/1989 | Japan |
| 1-302865 | 12/1989 | Japan |
| 2-199842 | 8/1990 | Japan |
| 2-297969 | 12/1990 | Japan |

*Primary Examiner*—Olik Chaudhuri
*Assistant Examiner*—Richard A. Booth
*Attorney, Agent, or Firm*—Frishauf, Holtz, Goodman & Woodward

[57] ABSTRACT

A method of manufacturing a thin-film transistor which comprises the steps of forming a gate electrode on an insulating substrate, a gate insulating film covering the gate electrode, and an i-type a-Si layer on the gate insulating film, forming a blocking film made of metal such as Cr or the like on a channel-forming region of the i-type a-Si layer, and forming an n-type a-Si layer covering the i-type a-Si layer and the blocking film, forming a metal layer on the n-type a-Si layer, and etching a predetermined portion of the n-type a-Si layer and a predetermined portion of the metal layer, thereby forming a source electrode and a drain electrode. That portion of the blocking film which is located below a gap between the source electrode and the drain electrode is removed from the i-type a-Si layer.

16 Claims, 5 Drawing Sheets

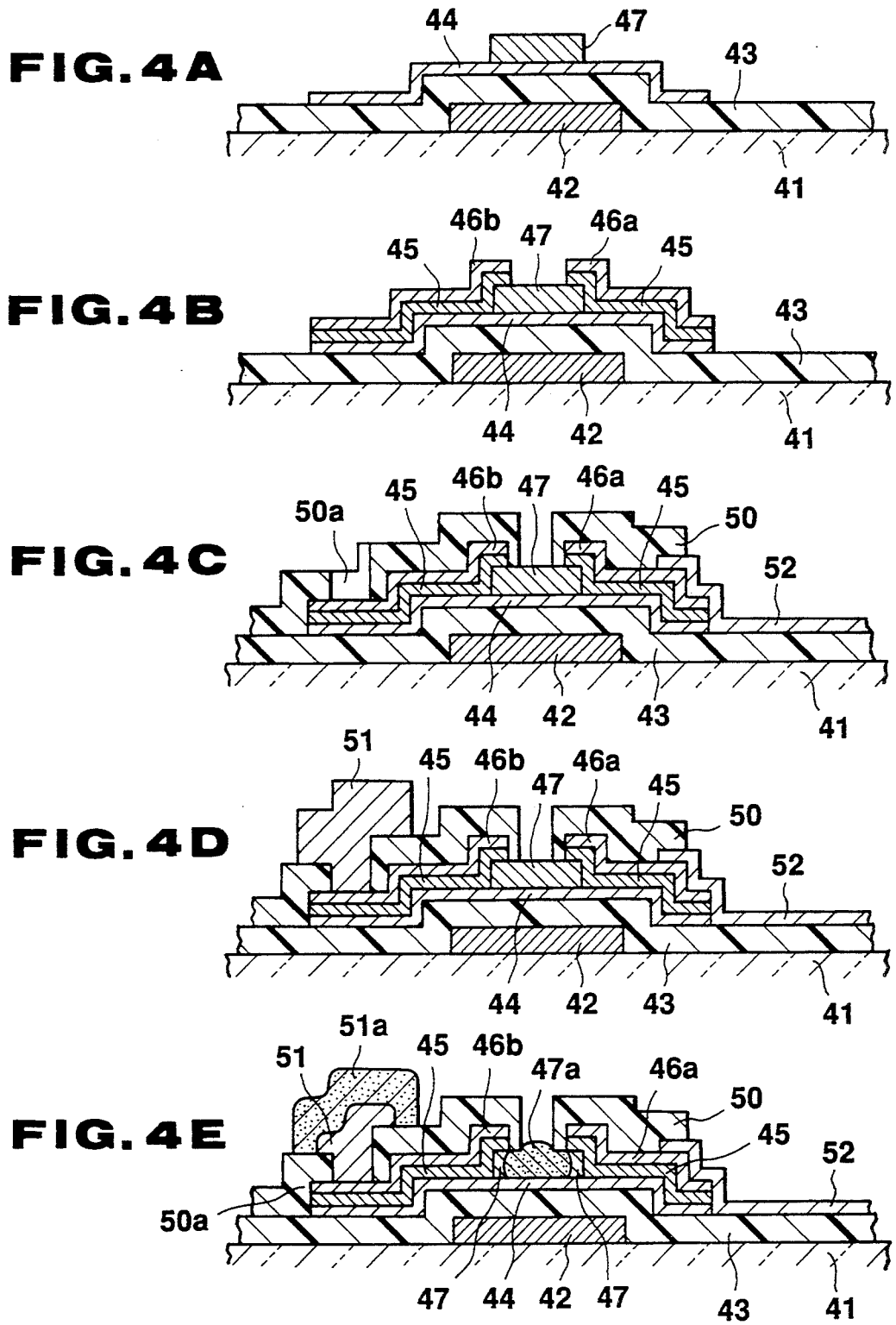

METHOD OF MAKING A THIN FILM TRANSISTOR

BACKGROUND OF THE INVENTION

1. Field of the Invention

The present invention relates to a thin-film transistor having thin semiconductor films formed on an insulating substrate, and also to a method of manufacturing the thin-film transistor.

2. Description of the Related Art

Thin-film transistors (TFTs), each comprising various thin films of a predetermined shape which are formed, one upon another, on an insulating substrate, are used as active elements in an active matrix liquid-crystal display. The active elements of the liquid-crystal display of this type are reverse stagger type TFTs.

As is shown in FIG. 5, the reverse stagger type TFT comprises a gate electrode 2 formed on the insulating substrate made of glass or the like, a gate insulating film 3 made of SiN (silicon nitride) and covering the gate electrode 2, an i-type semiconductor layer 4 made of a-Si (amorphous silicon) and formed on the gate insulating film 3 and opposing the gate electrode 2, an n-type semiconductor layer 5 made of a-Si doped with an n-type impurity and formed on the i-type semiconductor layer 4, and a source electrode 6a and a drain electrode 6b, both formed on the n-type semiconductor layer 5. A part of the n-type semiconductor layer 5 has been etched away, thus exposing the channel-forming region of the i-type semiconductor layer 4 and which is located below the gap between the source electrode 6a and the drain electrode 6b.

The thin-film transistor shown in FIG. 5 is manufactured in the following method. First, the gate electrode 2 is formed on the insulating substrate 1. Then, the gate-insulating film 3, the i-type semiconductor layer 4, and the n-type semiconductor layer 5 are formed, one upon another in the order mentioned, on the substrate 1 and the gate electrode 2. The source electrode 6a and the drain electrode 6b are formed, spaced apart from each other, on the n-type semiconductor layer 5. Thereafter, said part of the n-type semiconductor layer 5 has been etched away, thus exposing the channel-forming region of the i-type semiconductor layer 4 which is located below the gap between the electrodes 6a and 6b. The n-type semiconductor layer 5 should not contact the channel-forming region. If the layer 5 contacts the channel-forming region, the surface of the i-type semiconductor layer 4 will inevitably be etched and damaged when said part of the layer 5 is etched away.

To prevent such damage to the i-type semiconductor layer 4, a blocking film 7 is formed on the channel-forming region of the i-type semiconductor layer 4 as is shown in FIG. 5. Hitherto, the blocking film 7 is made of SiN. The blocking film is formed in the following way. After the i-type semiconductor layer 4 has been formed on the gate insulating film 3 covering the gate electrode 2, an SiN film is deposited on the i-type semiconductor layer 4 by means of plasma CVD method. Next, the SiN film is patterned, forming the blocking film 7 large enough to cover the entire channel-forming region. Then, the n-type semiconductor layer 5, the source electrode 6a, and the drain electrode 6b are formed, and that part of the layer 5 which is located on the blocking film 7 is etched away, in the method specified above.

Since the blocking film 7, thus formed, covers the channel-forming region of the i-type semiconductor layer 5, it protects the channel-forming region from damage which may be done during the etching of the n-type semiconductor layer 5.

The conventional method of manufacturing a thin-film transistor is disadvantageous, however, because the blocking film 7 is made of SiN. When the SiN film is patterned to form the blocking film 7, defects such as pinholes may be formed in the gate insulating film 4 which is located below the i-type semiconductor layer 5. The etchant used to pattern the SiN film flows through pinholes, if any in the i-type semiconductor layer 4, reaching the gate insulating film 3. The etchant inevitably etches the gate insulating film 3, forming defects, such as pinholes, also in the gate insulating film 3.

Pinholes, if made in the gate insulating film 3, cause interlayer short-circuiting between the gate electrode 2, on the one hand, and the source electrode 6a and the drain electrode 6b, on the other. This is because the n-type semiconductor layer 5 and the electrodes 6a and 6b are formed after the blocking film 7 has been formed by patterning the SiN film. Interlayer short-circuiting may take place, not only between the gate electrode 2 and the electrodes 6a and 6b, but also between the gate line (not shown) formed integral with the gate electrode 2 and the data line (not shown) formed integral with the source electrode 6a and or the data line integral with the drain electrode 6b, or between the data lines integral with the electrodes 6a and 6b.

Therefore, it is quite probable that the thin-film transistor can be manufactured by the conventional method, but at a low yield.

SUMMARY OF THE INVENTION

The object of the present invention is to provide a method of manufacturing a thin-film transistor, in which a blocking film for protecting the channel-forming region against damage is provided, in order to enable manufacturing of the thin-film transistor at a sufficiently high yield.

To achieve this objective, a method of manufacturing a thin-film transistor, according to the invention, comprises a first step of forming a gate electrode, a gate insulating film and a first i-type a-Si thin film, one upon another, on an insulating substrate; a second step of forming a blocking film made of thin metal film on the channel-forming region of the i-type a-Si thin film; a third step of forming a second i-type a-Si thin film covering the first i-type a-Si thin film and the blocking film, forming a metal film on the second i-type a-Si thin film, and etching the metal film, thereby forming a source electrode and a drain electrode and a portion of the metal layer disposed between the source and drain electrodes; and a fourth step of removing that portion of the blocking film which is located below a gap between the source electrode and the drain electrode.

The blocking film is made of metal which can be etched with an etchant which has so small an etching power that it cannot etch the gate insulating film. The etchant flows to the gate insulating film through pinholes, if any in the first i-type a-Si thin film, while the blocking film is being patterned, it does not etch the gate insulating film, forming no defects in the gate insulating film. As a result, the gate electrode is not short-circuited to the source electrode or the drain electrode.

Hence, the thin-film transistor can be manufactured at a high yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 4A to 4E are cross-sectional views, explaining the steps of a method according to a fourth embodiment of the present invention.

DETAILED DESCRIPTION OF THE PREFERRED EMBODIMENTS

First Embodiment

An embodiment of the invention, which is a method of manufacturing a thin-film transistor, will now be described, with reference to FIGS. 1A to 1E.

Step 1

Figure 1A:
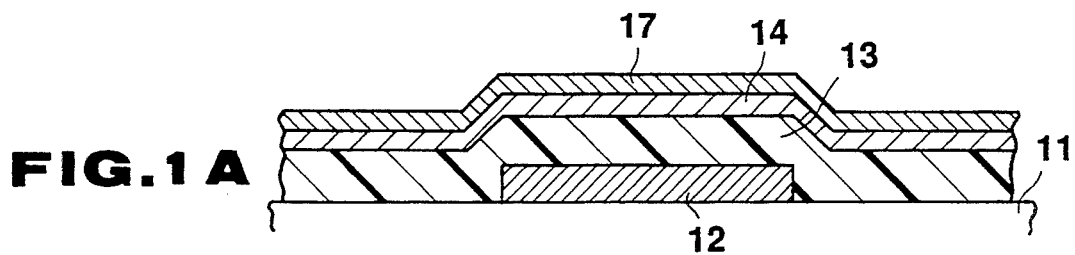
FIGS. 1A to 1E are cross-sectional views, explaining the steps of a method according to a first embodiment of this invention.

As is shown in FIG. 1A, a gate electrode 12 and a gate line (not shown) are formed on an insulating substrate 11 made of glass or the like. A gate insulating film 13 made of SiN is formed on the substrate 11, the gate electrode 12 and the gate line. An i-type semiconductor layer 14 made of a-Si is formed on the gate insulating film 13. A blocking film 17 made of metal is formed on the i-type semiconductor layer 14.

More specifically, the gate electrode 12 and the gate line are formed by forming a metal layer on the substrate 11 by sputtering and patterning the metal layer by photolithography. The gate insulating film 13 and the i-type semiconductor layer 14 are continuously formed by means of CVD method. The blocking (metal) film 17 is formed by sputtering.

The metal forming the blocking film 17 can be one, such as Cr (chromium), which can be etched with a weak etchant such as a non-hydrofluoric acid-based etchant, at an etching rate much different from the etching rate of an n-type semiconductor layer (later described).

Step 2

Figure 1B:
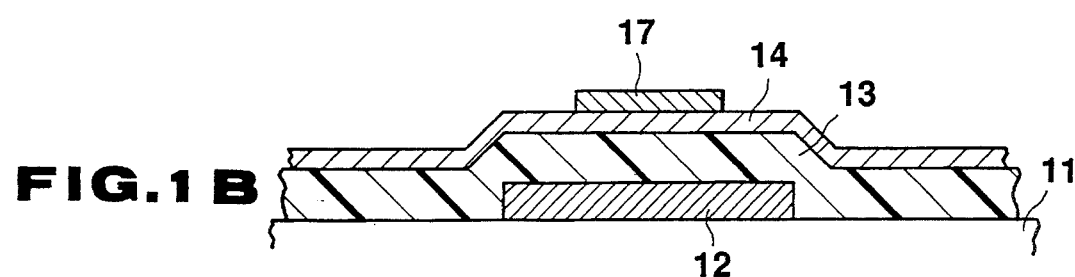

Next, as is shown in FIG. 1B, the blocking film 17 is patterned by photolithography, forming a strip covering that portion of the i-type semiconductor layer 14 which will be a channel-forming region. In the photolithography, wet etching is performed, using a non-hydrofluoric acid-based etchant.

When the blocking film 17 formed on the i-type semiconductor layer 14 is patterned, the non-hydrofluoric acid-based etchant flows through defects such as pinholes, if any, in the i-type semiconductor layer 14, reaching the gate insulating film 13. Nonetheless, the etchant scarcely etches the film 13 since it is an acid having a small etching power.

Were the blocking film 17 made of SiN as in the conventional method, it should be patterned with an acid, such as hydrofluoric acid, which has a great etching power. If this acid flowed through the defects (e.g., pinholes) made in the i-type semiconductor layer 14 and reached the gate insulating film 12, it would inevitably etch the gate insulating film 12, too, during the etching of the blocking film 17. Since the film 17 is made of metal (e.g., Cr) which can be etched with a non-hydrofluoric acid-based etchant having a small etching power, the blocking film can be patterned without etching the gate insulating film 12.

Step 3

Figure 1C:
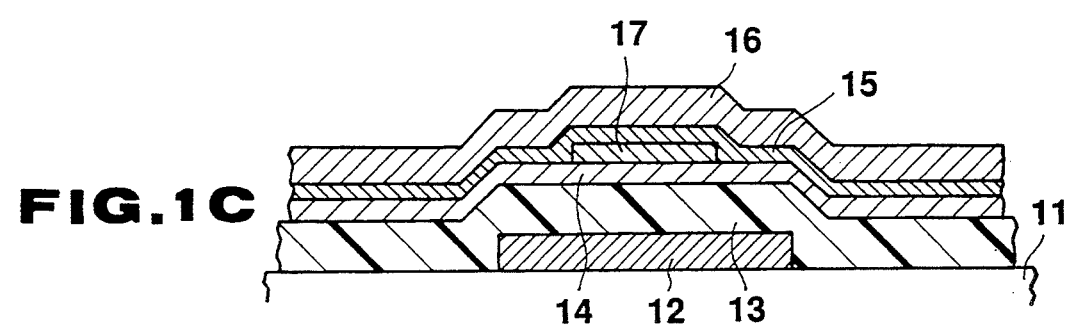

Then, as is shown in FIG. 1C, an n-type semiconductor layer 15 made of a-Si doped with an n-type impurity is formed by plasma CVD method on the i-type semiconductor layer 14 and also on the blocking film 17 formed on the layer 14. Further, a metal layer 16 for forming a source and a drain electrode is formed on the n-type semiconductor layer 15 by means of sputtering.

Step 4

Figure 1D:
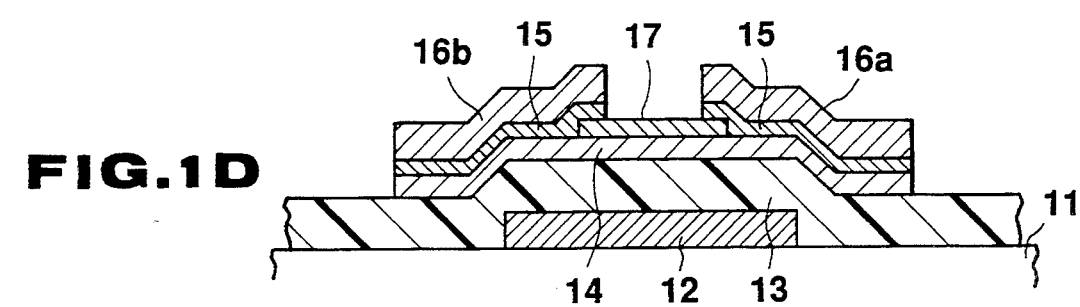

As is shown in FIG. 1D, the metal layer 16 formed on the n-type semiconductor layer 15 is patterned by photolithography, thereby forming a source electrode 16a, a drain electrode 16b, and a data line (not shown). Next, the n-type semiconductor layer 15 is divided into two parts, forming a gap and exposing the blocking film 17, as is shown in FIG. 1D. The i-type semiconductor layer 14 is patterned into an element layer having the shape and size of the thin-film transistor to manufacture.

The patterning of the n-type semiconductor layer 15 is effected by the use of a resist mask formed on the metal layer 16 and used to form the source electrode 16a, the drain electrode 16b, and the data line (not shown). Hence, those portions of the n-type semiconductor layer 15 which are located below the electrodes 16a and 16b and the data line are left on the i-type semiconductor layer 14. The resist mask is removed from the metal layer 16. Thereafter, a resist mask is formed, which covers the entire element layer and also the data line. Using this resist mask, the i-type semiconductor layer 14 is patterned, whereby those portions of the layer 14 which are located below the electrodes 16a and 16b and the data line are left on the substrate 11.

As has been indicated, the blocking film 17, which is formed on the channel-forming region of the i-type semiconductor layer 14, is made of metal such as Cr. Therefore, the source electrode 16a and the drain electrode 16b remain short-circuited to each other by the blocking film 17 even after that portion of the n-type semiconductor layer 15 which is located above the film 17 been etched away.

Step 5

Figure 1E:
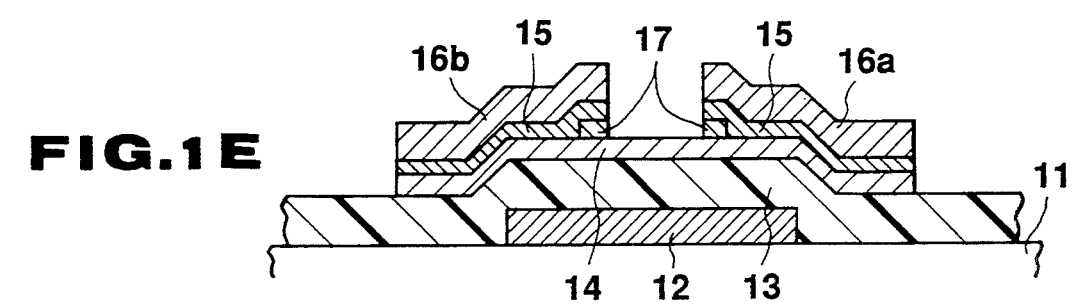

After said portion of the n-type semiconductor layer 15 has been removed, that portion of the blocking film 17 which is exposed through the opening made in the layer 15 is etched away as is shown in FIG. 1E. As a result, the source electrode 16a and the drain electrode 16b are electrically isolated, and a thin-film transistor is thereby made. The etching of the blocking film 17 is performed by using the resist mask formed on the electrodes 16a and 16b and the data line.

The blocking film 17 (i.e., a metal film) is etched with an etchant having small etching power, such as a non-hydrofluoric acid-based etchant. Even if the channel-forming region of the i-type semiconductor layer 4 has defects such as pinholes, there is no possibility that the gate insulating film 13 is etched with the etchant used to etch the blocking film 17.

Since the blocking film 17 formed on the channel-forming region of the i-type semiconductor layer 14 is made of metal, it can be readily etched by an etchant having small etching power (e.g., a non-hydrofluoric acid-based etchant). Even if the etchant flows through the defects in the i-type semiconductor layer 14 to the gate insulating film 13, it cannot etch the gate insulating film 13 to make defects in the the film 13.

It is therefore possible to pattern the blocking film 17 without etching the gate insulating film 13. No short-circuit will occur between the gate electrode 12 and the source electrode 16a or the drain electrode 16b, between the source electrode 16a and the drain electrode 16b, or between the gate line and the data line. This helps to enhance the yield of the thin-film transistor.

In the method described above, that portion of the n-type semiconductor layer 15 which is located above the blocking film 17 is etched away, thus dividing the layer 15 into two portions and exposing a portion of the blocking film 17. This portion of the film 17 is removed to electrically isolate the source electrode 16a and the drain electrode 16b from each other. The step of removing the portion of the film 17 is not included in the conventional method in which the blocking film is made of electrically insulating material (i.e., SiN). Nonetheless, the method described above is advantageous than the conventional method in the following respect.

The blocking film 17 made of metal can be formed within a far shorter time than a blocking film made of SiN. It can be formed by a sputtering apparatus which is more simple and less expensive than a plasma CVD apparatus which is used to form an SiN film. Hence, the method described above is advantageous in view of the cost of forming a blocking film. In addition, the method described above serves to reduce the manufacturing cost of thin-film transistors much more than the conventional method, since it provides a high yield of thin-film transistors as has been indicated above.

As has been described, the blocking film 17 is made of Cr. Nonetheless, it can be made of any other metal that can be etched with a weak etchant not able to etch the gate insulating film 13 and at a rate much different from the etching rate of the film 13. Also, the material of the gate insulating film 13 is not limited to SiN; the film 13 can be formed of SiO (silicon oxide).

As has been described, the n-type semiconductor layer 15 is patterned, the i-type semiconductor layer 14 is then patterned, and that portion of the blocking film 17 which is exposed through the opening made in the layer 15 is removed. Instead, the patterning of the i-type semiconductor layer 14 can be performed after the patterning of the blocking film 17 (that is, before the forming of the n-type semiconductor layer 15), or after the removal of said portion of the blocking film 17. In either case, the resist mask on the metal layer 16, used to form the source electrode 16a and the drain electrode 16b, can be utilized to etch both the n-type semiconductor layer 15 and the blocking film 17.

In the embodiment described above, the metal layer 16 is formed immediately after the n-type semiconductor layer 15. Instead, the layer 16 can be formed after the layer 15 has been patterned, forming the source electrode 16a and the drain electrode 16b. If so, that portion of the blocking film 17 which is exposed through the opening made in the layer 15 may be removed prior to the forming of the metal layer 16. In other words, the removal of said portion of the film 17 may be carried out after a part of the layer 15 has been etched away, forming the opening in the layer 15.

Second Embodiment

Another embodiment of the invention, which is a method of manufacturing a thin-film transistor, will now be described, with reference to FIGS. 2A to 2E.

Step 1

Figure 2A:
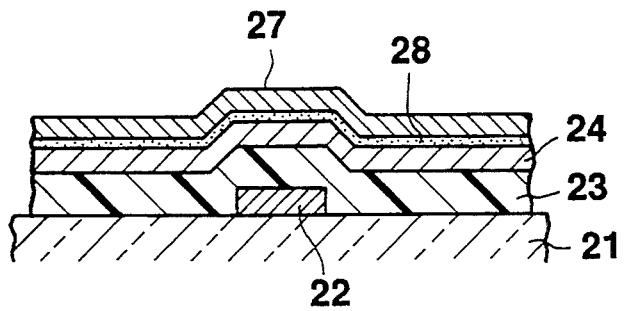
FIGS. 2A to 2E are cross-sectional views, explaining the steps of a method according to a second embodiment of the present invention.

As is shown in FIG. 2A, a gate electrode 22 is formed on an insulating substrate 21 made of glass or the like, in the same way as in the conventional method. A gate insulating film 23 made of SiN is formed on the substrate 21 and the gate electrode 22. An i-type semiconductor layer 24 made of a-Si is formed on the gate insulating film 23. A metal film 27, which will be processing into a blocking film, is formed on the i-type semiconductor layer 24. The gate insulating film 23 and the i-type semiconductor layer 24 are sequentially formed by a plasma CVD apparatus. The metal film 27 is formed by a sputtering apparatus.

When the metal film 27 is formed on the i-type semiconductor layer 24 made of a-Si, a metal silicide layer 28 (hereinafter referred to as "silicide layer") is formed at the interface between the semiconductor layer 24 and the metal layer 27.

Step 2

Figure 2B:
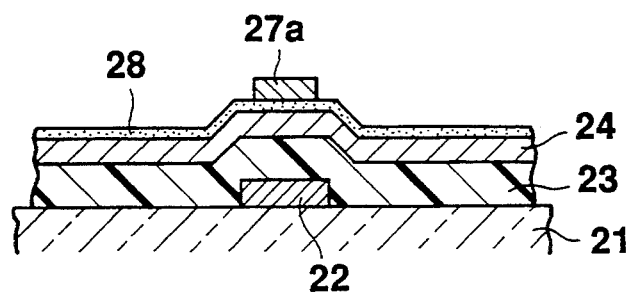

Next, as is shown in FIG. 2B, the metal film 27 is patterned by photolithography, or wet etching, forming a blocking film 27a which covers the channel-forming region of the i-type semiconductor layer 24. The patterning of the metal film 27 is accomplished with an etchant which cannot etch the gate insulating film 23 which is made of SiN. Hence, the gate insulating film 23 will not be damaged even if the etchant used in patterning the metal film 27 flows to the insulating film 23 through pinholes, if any, made in the i-type semiconductor layer 24.

The silicide layer 28 formed at the interface between the semiconductor layer 24 and the metal layer 27 at the time of forming the metal layer 27 remains on the i-type semiconductor layer 24 since it can hardly be etched with the etchant used in patterning the metal film 27. The silicide layer 28 must be removed. Unless it is removed, no good ohmic contact will be formed between the i-type semiconductor layer 24 and an n-type semiconductor layer 25 to be formed on the layer 24, since the silicide layer 28 is electrically conductive.

Step 3

Figure 2C:
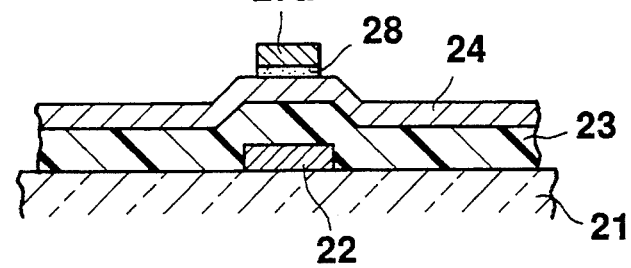

After the blocking film 27a has been formed, the silicide layer 28 is removed, except for the portion located beneath the blocking film 27a, as is shown in FIG. 2C. More specifically, the surface of the i-type semiconductor layer 24 is first oxidized with oxygen plasma, and is then etched with a weak, hydrofluoric acid [(NH$_4$)F]-based etchant. As a result, the silicide layer 28 is removed, and the surface of the i-type semiconductor layer 24 is cleaned.

As the surface of the i-type semiconductor layer 24 is oxidized, the metal component of the silicide layer 28 is oxidized into metal oxide. The silicide layer 28 is therefore readily etched away, even with a weak, hydrofluoric acid-based etchant.

The oxidation described above is performed for a specific time determined by the thickness of the silicide layer 28, so that the exposed portion of the layer 28 on the layer 24 is oxidized throughout its thickness without oxidizing any part of the i-type semiconductor layer 24 located beneath the silicide layer 28. The etching of the layer 28 is continued for a specific time determined by the thickness of the layer 28, too.

Since the etchant applied to the silicide layer 28 is a weak, hydrofluoric acid-based one, it does not etch or damage the gate insulating film 23 even if it flows to the film 23 through the pinholes made in the i-type semiconductor layer 24.

Step 4

Figure 2D:
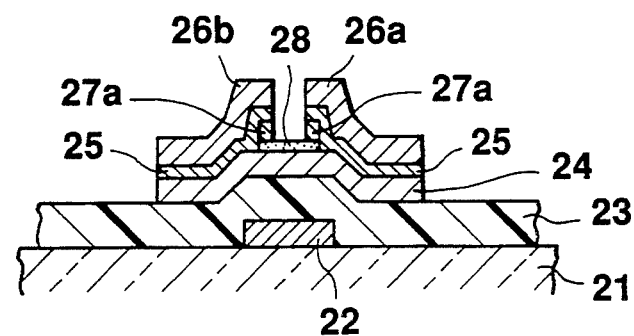

Next, as is shown in FIG. 2D, an n-type semiconductor layer 25 made of a-Si doped with an n-type impurity is formed on the i-type semiconductor layer 24 and the blocking film 27a. Further, a source electrode 26a and a drain electrode 26b are formed on the n-type semiconductor layer 25. That portion of the n-type semiconductor layer 25 which is located above the blocking film 27a is etched away, thereby exposing the channel-forming region of the i-type semiconductor layer 24.

In Step 4, the n-type semiconductor layer 25 is formed by a plasma CVD apparatus, a metal layer for forming the source and drain electrodes is formed on the layer 25 by a sputtering apparatus, and the layer 25 and the layer 24 located beneath the layer 25 are patterned into an element region by photolithography—as in the conventional method. Thereafter, that portion of the metal layer which is located above the channel-forming region of the layer 24 is etched away, thus forming the source electrode 26a and the drain electrode 26b. That portion of the n-type semiconductor layer 25 which is exposed through the gap between the electrodes 26a and 26b is then etched away. Since the blocking film 27a is located beneath this portion of the n-type semiconductor layer 25, it protects the channel-forming region of the layer 24 from the etchant used in etching the layer 25. Hence, the channel-forming region is not damaged at all.

That portion of the blocking film 27a, now exposed after the n-type semiconductor layer 25 divided into two parts, is etched away with the etchant applied in patterning the metal film 27 in Step 2. This etchant does not damage the i-type semiconductor layer 24. Nor does it damage the gate insulating film 23 even if it flows to the film 23 through the pinholes made in the layer 24, because the etchant cannot etch SiN, i.e., the material of the film 23.

Once the center portion of the blocking film 27a is removed, the source electrode 26a and the drain electrode 26b, which have been short-circuited, are electrically isolated. The two parts of the blocking film 27a, which have been formed by the removal of the center portion of the film 27a, are covered with the n-type semiconductor layer 25, they remain unetched as is shown in FIG. 2D. This imposes no problems since these parts are electrically isolated from each other.

The silicide layer 28 on the channel-forming region of the i-type semiconductor layer 24 imposes a problem. The silicide layer 28 has not been etched with the etchant used in removing the center portion of the blocking film 27a. Since the silicide layer 28 is electrically conductive, it will cause a source-drain leakage in the channel-forming region of the i-type semiconductor layer 24. Hence, the layer 28 must be removed form the surface of the channel region.

Step 5

Figure 2E:
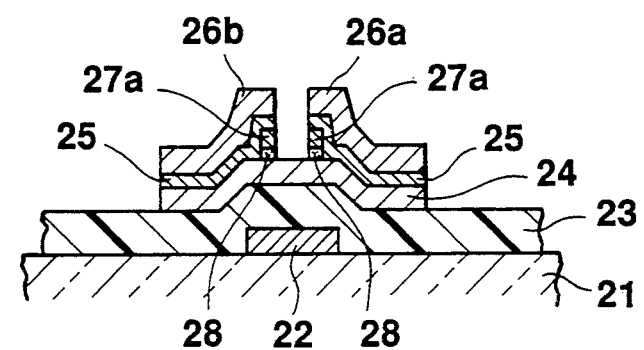

The silicide layer 28 is removed from the surface of the channel-forming region of the semiconductor layer 24 as is shown in FIG. 2E, after the center portion of the blocking film 27a has been removed. As a result, a thin-film transistor is manufactured.

The silicide layer 28 is removed in Step 5 in the same way as in Step 3. That is, the surface of the channel-forming region of the i-type semiconductor layer 24 is first oxidized with oxygen plasma and is then etched with a weak, hydrofluoric acid-based etchant. Also in Step 5, as the surface of the layer 24 is oxidized, the metal component of the silicide layer 28 is oxidized into metal oxide. The silicide layer 28 is therefore readily etched away, even with a weak, hydrofluoric acid-based etchant. In addition, the etchant applied to the silicide layer 28, which is weak, does not etch or damage the gate insulating film 23 even if it flows to the film 23 (made of SiN) through the pinholes made in the i-type semiconductor layer 24.

In Step 5, too, only the silicide layer 28 on the i-type semiconductor layer 24 is oxidized for a specific time determined by the thickness of the silicide layer 28, so that it is oxidized throughout its thickness without oxidizing any part of the i-type semiconductor layer 24 located beneath the silicide layer 28. The etching of the layer 28 is continued for a specific time determined by the thickness of the layer 28, too.

Once the silicide layer 28 is removed from the channel-forming region of the layer 24, the surface of the channel region is cleaned. Hence, a channel having good properties and causing no source-drain leakage is formed in the i-type semiconductor layer 24.

It is only the center portion of the silicide layer 28 that is removed in Step 5. The other portions of the layer 28, which are covered with the remaining portions of the blocking film 27a, remain on the opposing sides of the two separated parts of the n-type semiconductor layer 25 as is shown in FIG. 2E. Nonetheless, the remaining portions of the silicide layer 28 impose no problems at all. They are now electrically isolated from each other, because the center part of the silicide layer 28 has been removed.

Once the silicide layer 28 has been removed, the i-type semiconductor layer 24 becomes thinner by the thickness of the silicide layer 28. This reduction in the thickness of the layer 24 causes virtually no problems since the thickness of the silicide layer 24 is only 10 nm or less.

As has been described, the blocking film 27a protecting the channel-forming region of the i-type semiconductor layer 24 is a metal film formed by patterning the metal film 27 with an etchant which cannot etch the gate insulating film 23 made of SiN. Hence, the film 23 is not damaged at all even if this etchant flows to the film 23 through pinholes made in the i-type semiconductor layer 24. Further, since the center portion of the blocking film 27a is removed after the n-type semiconductor layer 25 has been divided into two parts, the source electrode 26a and the drain electrode 26b are electrically isolated.

As has been indicated, after the blocking film 27a has been formed by patterning the metal film 27, the silicide layer 28, except the portion beneath the film 27a, is removed from the i-type semiconductor layer 24. Then, the n-type semiconductor layer 25, the source electrode 26a, and the drain electrode 26b are formed. Therefore, a good ohmic contact is formed between the layers 24 and 25. In addition, since the silicide layer 28 is removed from the channel-forming region of the i-type semiconductor layer 24 after the blocking film 27a has been removed, a channel causing no source-drain leakage is formed in the layer 24.

Hence, the method described with reference to FIGS. 2A to 2E is advantageous in that the blocking film 27a protecting the channel-forming region of the i-type semiconductor layer 24 is formed without damaging the gate insulating film 23, whereby no short-circuiting occurs between the gate electrode 22, on the one hand, and the source electrode 26a and the drain electrode 26b, on the other hand, thus enhancing the yield of the thin-film transistors. In addition, the method can provide a thin-film transistor having good characteristics, which has a good ohmic contact between the i-type semiconductor layer 24 and the n-type semiconductor layer 25 and which is free of a source-drain leakage.

The oxidation for removing the silicide layer 28 can be achieved by using an oxidizing agent such as nitric acid, instead of oxygen plasma. Alternatively, it can be accomplished by ozone oxidation effected by applying ultraviolet rays. Whether the oxidizing agent is used or the ozone oxidation is employed, the silicide layer 28 can be oxidized, scarcely oxidizing and damaging the surface of the i-type semiconductor layer 24 located below the silicide layer 28. The characteristics of the thin-film transistor are, therefore, readily prevented from being degraded.

Third Embodiment

A third embodiment of the invention, which is a method of manufacturing a thin-film transistor, will be described, with reference to FIGS. 3A to 3F. In this method, no metal silicide is formed at the interface between an i-type semiconductor layer and a metal film for a blocking film, as the metal film is formed on the i-type semiconductor layer.

Step 1

Figure 3A:
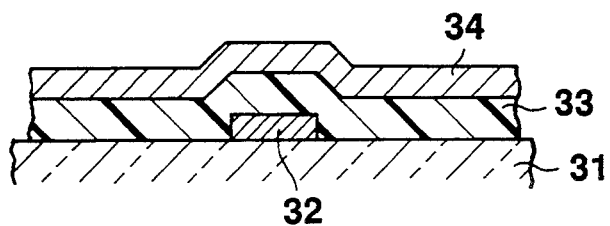
FIGS. 3A to 3F are cross-sectional views, explaining the steps of a method according to a third embodiment of the invention.

As is shown in FIG. 3A, a gate electrode 32 is formed on an insulating substrate 31 made of glass or the like, in the same way as in the conventional method. A gate insulating film 33 made of SiN is formed on the substrate 31 and the gate electrode 32. An i-type semiconductor layer 34 made of a-Si is formed on the gate insulating film 33. The gate insulating film 33 and the i-type semiconductor layer 34 are sequentially formed by a plasma CVD apparatus.

Step 2

Figure 3B:
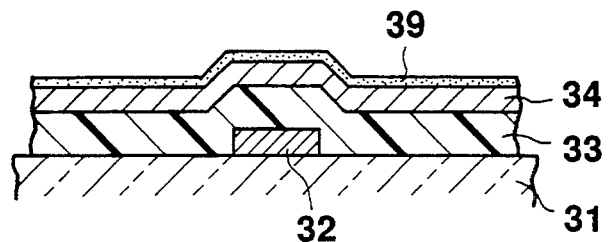

As is shown in FIG. 3B, the surface of the i-type semiconductor layer 34 is oxidized with oxygen plasma, thereby forming a silicon oxide (SiO$_2$) film 39 having a thickness of about 10 nm.

Step 3

Figure 3C:
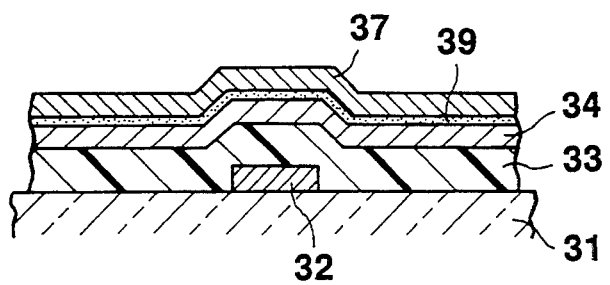

Next, as is shown in FIG. 3C, a method film 37 made of chromium (Cr), aluminum (Al), an aluminum alloy, or the like is formed on the silicon oxide film 39 by a sputtering apparatus. Since the metal film 27 is formed after the silicon oxide film 39 has been formed on the surface of the i-type semiconductor layer 34, no metal silicide layer is formed on the layer 34, unlike in the case where a metal layer is formed directly on the layer 34 made of amorphous silicon.

Step 4

Figure 3D:
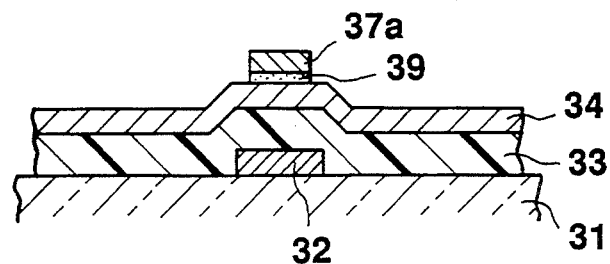

As is shown in FIG. 3D, the metal film 37 is patterned by photolithography, thereby forming a blocking film 37a, which covers the channel-forming region of the i-type semiconductor layer 34. Thereafter, the silicon oxide film 39 is removed, except for that portion covered by the blocking film 37a and not exposed even after the patterning of the metal film 37. As a result, the entire surface of the i-type semiconductor layer 34, except that of the channel-forming region, is cleaned and exposed.

The patterning of the metal film 37 is effected by means of wet etching, using an etchant which can not etch the gate insulating film 33 which is made of SiN. Hence, the gate insulating film 33 will not be damaged even if this etchant flows to the film 33 through pinholes made in the i-type semiconductor layer 34.

The silicon oxide film 39 is etched with a weak etchant, such as a hydrofluoric acid [(NH$_4$)F]-based etchant, which cannot readily etch the gate insulating film 33 made of SiN. Further, since the silicon oxide film 39 is so thin (about 10 nm thick) that it can be etched within a short time, which the etchant can hardly flow to the film 33 through pinholes made in the i-type semiconductor layer 34. Therefore, the gate insulating film 33 will scarcely be damaged with the etchant used in etching the silicon oxide film 39.

Step 5

Figure 3E:
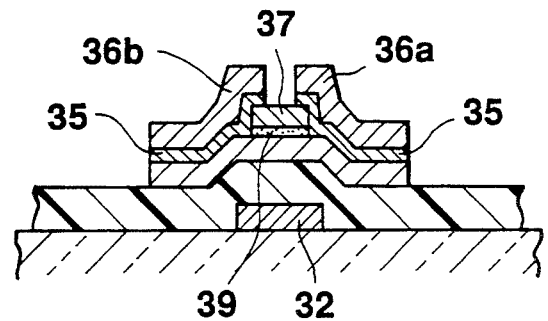

Then, as is shown in FIG. 3E, an n-type semiconductor layer 35 made of a-Si doped with an n-type impurity is formed on the i-type semiconductor layer 34 and the blocking film 37a. Further, a source electrode 36a and a drain electrode 36b are formed on the n-type semiconductor layer 35. That portion of the n-type semiconductor layer 35 which is located on the blocking film 37a is etched away, thereby exposing the blocking film 37a.

In Step 5, the n-type semiconductor layer 35 is formed by a plasma CVD apparatus, a metal layer for forming the source and drain electrodes is formed on the layer 35 by a sputtering apparatus, and the layer 35 and the layer 34 located beneath the layer 35 are patterned into an element region by means of photolithography. Thereafter, that portion of the metal layer which is located above the channel-forming region of the layer 34 is etched away, thus forming the source electrode 36a and the drain electrode 36b. That portion of the n-type semiconductor layer 35 which is exposed through the gap between the electrodes 36a and 36b is then etched away. Since the blocking film 37a is located beneath this portion of the n-type semiconductor layer 35, it protects the channel-forming region of the layer 34 from the etchant used in etching the layer 35. Hence, the channel-forming region is not damaged at all.

Step 6

Figure 3F:
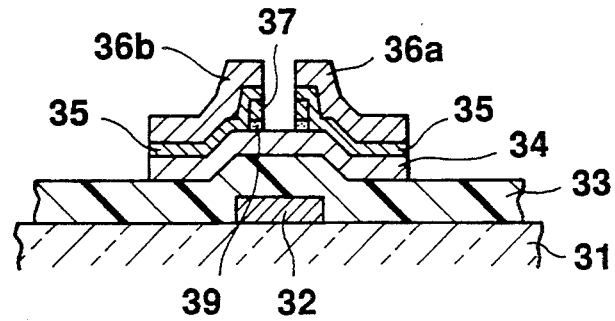
Figure 5:
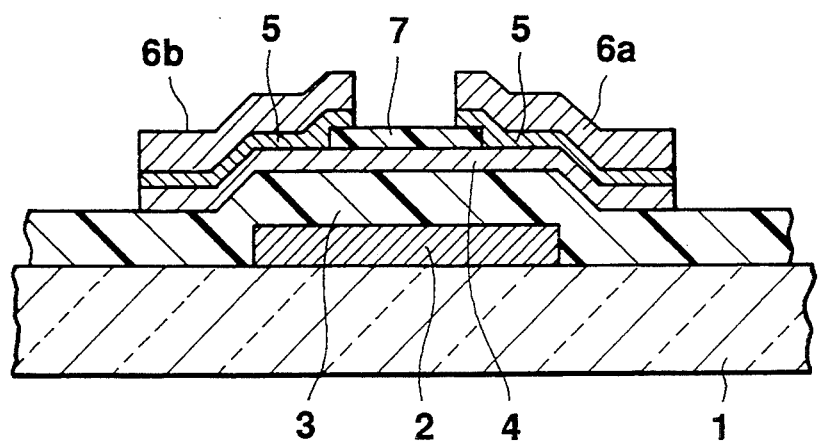
FIG. 5 is a cross-sectional view showing a conventional thin-film transistor.

Next, as is shown in FIG. 3F, that portion of the blocking film 37a, now exposed after the n-type semiconductor layer 35 divided into two parts, is removed, thereby exposing the channel-forming region of the i-type semiconductor layer 34. Then, the silicon oxide film 39 remaining on the channel-forming region is removed. As a result, a thin-film transistor is made.

In Step 6, the etchant used to pattern the metal film 37 in Step 4 is utilized to remove that portion of the blocking film 37a which has been exposed through the gap between the two parts of the n-type semiconductor layer 35. Hence, the etchant does not damage the i-type semiconductor layer 34. Since the etchant can hardly etch the gate insulating film 33 made of SiN, it will not damage the film 33 even if it flows to the film 33 through pinholes made in the i-type semiconductor layer 34.

Once the blocking film 37a has been removed, the source electrode 36a and the drain electrode 36b are no longer short-circuited; they are electrically isolated. The end portions of the film 37a remain intact as is shown in FIG. 3F since they are covered with the two separated parts of the n-type semiconductor layer 35. Nonetheless, the remaining portions of the film 37a impose no problems at all, though they are made of metal. They are electrically isolated from each other, because the center part of the film 37a has been removed.

As has been indicated, a weak, hydrofluoric acid-based etchant is applied to remove the remaining silicon oxide film 39 in Step 6, as has been used in Step 4 to the silicon oxide film 39. Hence, in Step 6, too, the etchant can hardly damage the gate insulating film 33 made of SiN even if it flows to the film 33 through pinholes made in the i-type semiconductor layer 34.

Since the blocking film 37a protecting the channel-forming region of the i-type semiconductor layer 34 is a metal film formed by patterning the metal film 37 with an etchant which cannot etch the gate insulating film 33 made of SiN. Thus, the film 33 is not damaged at all even if this etchant flows to the film 33 through pinholes formed in the i-type semiconductor layer 34. Further, since the center portion of the blocking film 37a is removed after the n-type semiconductor layer 35 has been divided into two parts, the source electrode 36a and the drain electrode 36b are electrically isolated.

As as been described, the metal film 37 is formed after the surface of the i-type semiconductor layer 34 has been oxidized, forming the silicon oxide film 39 on the layer 34. Hence, no metal silicide film is formed on the i-type semiconductor layer 34 as the metal layer 37 is formed on the layer 34.

Since the etchant used to etch the silicon oxide film 39 formed on the layer 34 can hardly etch silicon nitride (SIN), i.e., the material of the gate insulating film 33, it will scarcely damage the film 33 even if it flows to the film 33 through pinholes formed in the i-type semiconductor layer 34 while the film 39 is being removed. Similarly, since the etchant used to remove the silicon oxide film 39 from the channel-forming region of the layer 34 after the blocking film 37a has been removed can hardly etch SiN, this etchant will scarcely damage the gate insulating film 33 even if it flows to the film 33.

Hence, the method described with reference to FIGS. 3A to 3F is advantageous in that the blocking film 37a protecting the channel-forming region of the i-type semiconductor layer 34 is formed without damaging the gate insulating film 33, whereby no short-circuiting occurs between the gate electrode 32, on the one hand, and the source electrode 36a and the drain electrode 36b, on the other hand, thus enhancing the yield of the thin-film transistors. In addition, the method can provide a thin-film transistor having good characteristics, which has a good ohmic contact between the i-type semiconductor layer 34 and the n-type semiconductor layer 35 and which is free of a source-drain leakage.

The surface of the i-type semiconductor layer 34 is oxidized with an oxidizing, agent such as nitric acid, instead of oxygen plasma. Alternatively, it can be accomplished by ozone oxidation effected by applying ultraviolet rays.

In the third embodiment, the silicon oxide film 39 is removed from the channel-forming region of the i-type semiconductor layer 34 after the blocking film 37a has been removed. However, the silicon oxide film 39 need not be removed from the channel-forming region since it is an insulating film.

Fourth Embodiment

A fourth embodiment of the invention, which is a method of manufacturing a thin-film transistor, will be described, with reference to FIGS. 4A to 4E. The thin-film transistor is designed for use as an active element of an active matrix liquid-crystal display. The method is characterized in that a blocking film made of metal is anodically oxidized and made into an insulating film, electrically isolating the source and drain electrodes of the thin-film transistor.

Step 1

First, as is shown in FIG. 4A, a gate electrode 42 and a gate line (not shown) are formed on an insulating substrate 41 made of glass or the like. A gate insulating film 43 made of SiN is formed on the substrate 41, the gate electrode 42, and the gate line. An i-type semiconductor layer 44 made of a-Si is formed on the gate insulating film 43. Further, a blocking film 47 is formed on the i-type semiconductor layer 44. The blocking film 47 is made of the same metal as a data line 51 (later described), such as Al (aluminum) or an Al alloy.

In Step 1, the gate electrode 42 and the gate line are formed, first by forming a layer of metal such as Cr (chromium), Ta (tantalum), Al or an Al alloy formed on the substrate 41 by a sputtering apparatus, and then by patterning the metal layer by means of photolithography.

The gate insulating film 43 and the i-type semiconductor layer 44 are sequentially formed by a plasma CVD apparatus, and the blocking film 47 is formed by a sputtering apparatus. The layer 44 is patterned by photolithography, forming a layer having the shape and size of the thin-film transistor to manufacture. The blocking film 47 is also patterned by photolithography, forming a film covering the channel-forming region of the i-type semiconductor layer 44.

The patterning of the blocking film 47 made of metal is achieved by wet etching, using an etchant which cannot etch SiN, i.e., the material of the gate insulating film 43. This etchant will not damage the gate insulating film 43 even if it flows to the film 33 through pinholes formed in the i-type semiconductor layer 44.

The patterning of the i-type semiconductor layer 44 can be performed either before or after the blocking film 47 is formed on the layer 44.

Step 2

As is shown in FIG. 4B, an n-type semiconductor layer 45 made of a-Si doped with an n-type impurity is formed on the i-type semiconductor layer 44 and the blocking film 47. Further, a source electrode 46a and a drain electrode 46b are formed on the n-type semiconductor layer 45. That portion of the n-type semiconductor layer 45 which is located on the blocking film 47 is etched away, thereby exposing the blocking film 47 and forming two portions which are located below the electrodes 46a and 46b, respectively.

In Step 2, the n-type semiconductor layer 45 is formed by a plasma CVD apparatus. Thereafter, a metal layer made of, for example Cr, is formed on the layer 45 by a sputtering apparatus and is patterned by photolithography, forming the source electrode 46a and the drain electrode 46b. The n-type semiconductor layer 45 is patterned into a layer having a size and shape substantially identical to those of the i-type semiconductor layer 44. That portion of the n-type semiconductor layer 45 which is exposed through the gap between the electrodes 46a and 46b is then etched away. Since the blocking film 47 is located beneath this portion of the layer 35, it protects the channel-forming region of the layer 44 from the etchant used in etching the layer 45. Hence, the channel-forming region is not damaged at all.

Step 3

Next, as is shown in FIG. 4C, a pixel electrode 52 is formed on the gate insulating film 43 such that the electrode 52 is connected to the source electrode 46a. A protective insulating film 50 made of SiN is formed on the source electrode 46a and the drain electrode 46b. That portion of the film 50 which is located in and above the gap between the electrodes 46a and 46b is etched away, exposing the blocking film 47. At same time, a contact hole 50a is formed in the protective insulating 50, thereby exposing a portion of the drain electrode 46b.

The pixel electrode 52 is formed, first by forming a transparent conductive film of ITO or the like and then by patterning the conductive film by photolithography. The protective insulating film 50 is formed, first by forming an SiN film by a plasma CVD apparatus and then by patterning the SiN film by photolithography into a small film covering the transistor region of the unfinished product. The contact hole 50a is formed at the same time the protective insulating film 50 is patterned.

Step 4

As is shown in FIG. 4D, a data line 51 is formed on the protective insulating film 50 and also in the contact hole 50a made in the film 50. The data line 51 is connected to the drain electrode 46b and is much thicker than the blocking film 47. The data line 51 is formed, first by forming, by a sputtering apparatus, a layer made of the same metal as the blocking film 47 (Al or Al alloy) and having a thickness far greater than that of the film 47, and then by patterning the metal by means of photolithography.

Step 5

Thereafter, the surfaces of blocking film 47 and data line 51, both made of metals, are anodizing simultaneously, forming insulating oxide films 47a and 51a on the exposed portion of the blocking film 47 and the data line 51, respectively, as is shown in FIG. 4E. As a result, a thin-film transistor is made.

The anodization of the blocking film 47 and data line 51 is carried out in the following way. First, the substrate 41 is immersed in an electrolyte bath. Then, the exposed portion of the film 47 and the data line 51 are placed in face-to-face relation to a counter electrode (i.e., a platinum electrode). Finally, a voltage is applied between the film 47 and the line 51 (both used as anode), on the one hand, and the counter electrode (used as cathode), on the other hand. The positive voltage is applied to the film 47 and the line 51 by connecting the terminal of the data line 51 to the positive pole of an oxidation power supply (a DC power supply). More precisely, the positive voltage is first applied to the data line 51, and hence to the blocking film 47 through the drain electrode 46b and the n-type semiconductor layer 45 positioned beneath the electrode 46 and connected thereto.

The blocking film 47 and the data line 51 undergo forming reaction and are gradually oxidized from their surfaces as a voltage is applied between the counter electrode (i.e., the cathode), on the one hand, and the film 47 and the line 51 (i.e. the anode), on the other—all immersed in the electrolyte bath.

As is known in the art, a metal layer is anodized at a rate which is determined by the metal forming the film. Since the blocking film 47 and the data line 51 are made of the same metal, they are oxidized, from their surfaces, at substantially the same rate.

The depth to which the film 47 and the line 5 are anodized depends on the voltage applied between them, on the one hand, and the counter electrode, on the other. As has been indicated, the data line 51 is much thicker than the blocking film 47. The voltage applied for anodically oxidizing the film 47 and the line 51 is of such a value that the blocking film 47 is oxidized throughout its thickness, forming an insulating oxide film 47a, whereas the data line 51 is oxidized at its surface portion only.

When a metal layer is oxidized, its volume increases. Thus, the insulating oxide film 47a is thicker that the blocking film 47, and the data line 51 now having an insulating oxide film 51a (i.e., the oxidized surface portion) is thicker a little than before the anodic oxidation.

Since the blocking film 47 protecting the channel-forming region of the i-type semiconductor layer 44 is made of metal, it can be etched with an etchant which cannot etch the gate insulating film 43. In the fourth embodiment, such an etchant is used in patterning the blocking film 47, whereby no damages are made to the gate insulating film 43.

Since the blocking film 47 is made of metal, the source electrode 46a and the drain electrode 46b are short-circuited by the blocking film 47, immediately after the electrodes 46a and 46b have been formed by dividing the metal layer 46 into two parts. Nonetheless, the electrodes 46a and 46b are electrically isolated when the blocking film 47 is oxidized throughout its thickness. A channel is thereby formed in the i-type semiconductor layer 44.

The oxidation of the blocking film 47 is carried out by covering the source electrode 46a and the drain electrode 46b with the protective insulating film 50 and then removing that portion of the film 50 which is located above the gap between the electrodes 46a and 46b, thereby exposing the blocking film 47. Therefore, neither the source electrode 46a nor the drain electrode 46b is oxidized while the blocking film 47 is being oxidized.

As has been indicated, the data line 51 formed on the protective insulating film 50 is also oxidized, thereby forming the insulating oxide film 51a. The oxide film 51a thus formed protects the data line 51. Hence, it is unnecessary to form an overcoat insulating film on the data line as is required in the conventional method of manufacturing a thin-film transistor.

In the method described with reference to FIGS. 4A to 4E, the blocking film 47 for protecting the channel-forming region of the i-type semiconductor layer 44 is formed without damaging the gate insulating film 43. The gate electrode 42 is thereby prevented from being short-circuited to the source electrode 46a or the drain electrode 46b. Hence, with the method it is possible to manufacture thin-film transistors at a high yield.

Further, since the blocking film 47 (i.e., a metal film) is formed within a short time by a sputtering apparatus, and no overcoat insulating film needs to be formed on the data line, the number of films or layers which must be formed by a plasma CVD apparatus is less than in the conventional method. In addition, as has been described, the blocking film 47 and the data line 51 are oxidized at the same time. Therefore, thin-film transistors can be manufactured by the method with high efficiency and at low cost.

The blocking film 47 and the data line 51 may be made of different metals, rather than the same metal. More specifically, the data line 51 may be made of metal which is etched more slowly than the blocking film 47. If this is the case, the blocking film 47 will have been oxidized throughout its thickness by the time the data line 51 is oxidized at its surface portion only.

All embodiments described above are method of manufacturing a thin-film transistor which is to be used as an active element of an active matrix liquid-crystal display. Nevertheless, the present invention may be applied to the manufacture of a thin-film transistor which can be incorporated into various types of electronic circuits. If incorporated in a circuit, the transistor has its source and drain electrodes connected to conductive lines. More specifically, two contact holes are formed in the protective insulating film covering the source and drain electrodes, thus exposing portions of these electrodes, and two data lines extend through the contact holes and, hence, are connected to the source and drain electrodes, respectively, and the surface of each data line is oxidized at the same time the blocking film is oxidized.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a thin-film transistor, comprising:
   a first step of forming a gate electrode on an insulating member, a gate insulating film of silicon nitride covering the gate electrode, and an intrinsic amorphous silicon layer on the gate insulating film;
   a second step of oxidizing a surface of said intrinsic amorphous silicon layer, thereby forming a silicon oxide film;
   a third step of forming a metal layer on said silicon oxide film;
   a fourth step of etching said metal layer, forming a part of the metal layer covering a channel region of said intrinsic amorphous silicon layer;
   a fifth step of removing an exposed portion of said silicon oxide film;
   a sixth step of forming a conductive layer covering said intrinsic amorphous silicon layer and said metal layer, and etching a portion of the conductive layer, thereby forming source and drain electrodes and a portion of the conductive layer disposed between the source and drain electrodes; and
   a seventh step of removing a portion of said metal layer on the channel region.

2. A method of manufacturing a thin-film transistor, comprising:
   a first step of forming a gate electrode on an insulating substrate, a gate insulating film covering the gate electrode, and an intrinsic amorphous silicon layer on the gate insulating film;
   a second step of forming a blocking film made of metal on a channel-forming region of said intrinsic amorphous silicon layer;
   a third step of forming an n-type amorphous silicon layer covering said intrinsic amorphous silicon layer and said blocking film, forming a metal layer on the n-type amorphous silicon layer, and etching a portion of the n-type amorphous silicon layer and a portion of the metal layer, thereby forming a source electrode and a drain electrode; and
   a fourth step of anodically oxidizing that portion of said blocking film which is located below a gap between said source electrode and said drain electrode, thereby changing the portion of said blocking film into an insulating metal oxide film.

3. The method according to claim 2, wherein said fourth step comprises a step of applying a voltage to said drain electrode, thereby anodizing that portion of said blocking film which is located below a gap between said source electrode and said drain electrode.

4. The method according to claim 2, which further comprises a step of forming a data line connected to said drain electrode, for supplying a data signal to the thin-film transistor, and in which said fourth step includes a step of applying a voltage from the data line, thereby anodizing that portion of said blocking film which is located below a gap between said source electrode and said drain electrode.

5. A method of manufacturing a thin-film transistor, comprising:
   a first step of forming a gate electrode on an insulating member, a gate insulating film covering the gate electrode, and an intrinsic amorphous silicon layer on the gate insulating film;
   a second step of forming a blocking film made of metal on a channel-forming region of said intrinsic amorphous silicon layer, a metal silicide layer being formed in the channel-forming region of the intrinsic amorphous silicon layer;
   a third step of forming and etching a portion of the conductive layer, thereby forming a source electrode and a drain electrode;
   a fourth step of removing a portion of said blocking film which is located below a gap between said source electrode and said drain electrode;
   a fifth step of removing a region of the metal silicide layer on the channel forming region; and
   wherein said fifth step includes,
      a first sub-step of oxidizing the metal silicide layer on the channel-forming region which was exposed in the fourth step; and
      a second sub-step of removing the oxidized metal silicide layer.

6. The method according to claim 5, wherein said first sub-step includes an oxidizing step of oxidizing the metal silicide layer throughout its whole thickness.

7. The method according to claim 5, wherein said second sub-step includes a step of removing the oxidized metal silicide layer using a hydrofluoric acid-based etchant.

8. The method according to claim 5, wherein said fourth step includes a step of removing the portion of said blocking film using a non-hydrofluoric acid-based etchant.

9. The method according to claim 1, wherein said conductive layer includes a n-type amorphous silicon layer covering said intrinsic amorphous silicon layer and a metal film on the n-type amorphous silicon layer.

10. The method according to claim 1, wherein said fifth step is performed using an etchant for which an etching rate of the silicon oxide film is greater than that of silicon nitride.

11. The method according to claim 1, wherein said fourth step is performed using an etchant for which an etching rate of the metal is greater than that of silicon nitride.

12. The method according to claim 1, wherein said fifth step is performed using an etchant including a hydrofluoric acid based etchant.

13. The method according to claim 1, wherein said fourth step is performed using an etchant including a non-hydrofluoric acid-based etchant.

14. The method according to claim 1, wherein said silicon oxide film has a thickness of about 10 nm.

15. The method according to claim 1, wherein said conductive layer includes an n-type amorphous silicon layer covering said intrinsic amorphous silicon layer and a metal film formed on the n-type amorphous silicon layer.

16. A method of manufacturing a thin film transistor comprising:
- a first step of forming a gate electrode on an insulating member, a gate insulating film of silicon nitride covering the gate electrode, and an intrinsic amorphous silicon layer on the gate insulating film;
- a second step of forming a blocking film made of metal on a channel region of said semiconductor layer;
- a third step of forming a conductive layer overlying said semiconductor layer and said blocking film, and etching a portion of the conductive layer so as to form a source electrode and a drain electrode; and
- a fourth step of anodizing a portion of said blocking film located on said channel region thereby electrically separating the source and drain regions from each other.

* * * * *